ized. A resulting drop in match line (202) potential can

(12) United States Patent
Meng et al.

(10) Patent No.: US 7,084,672 B1
(45) Date of Patent: Aug. 1, 2006

(54) SENSE AMPLIFIER CIRCUIT FOR CONTENT ADDRESSABLE MEMORY DEVICE

(76) Inventors: Anita X. Meng, 692 Distel Dr., Los Altos, CA (US) 94022; Eric H. Voelkel, 1410 Dundee Ave., Ben Lomond, CA (US) 95005

( * ) Notice: Subject to any disclaimer, the term of this patent is extended or adjusted under 35 U.S.C. 154(b) by 0 days.

(21) Appl. No.: 10/873,608

(22) Filed: Jun. 22, 2004

Related U.S. Application Data

(60) Provisional application No. 60/483,418, filed on Jun. 27, 2003.

(51) Int. Cl.
*G11C 7/00* (2006.01)

(52) U.S. Cl. .......................... 327/51; 365/49
(58) Field of Classification Search ................. 365/49; 327/51
See application file for complete search history.

(56) References Cited

U.S. PATENT DOCUMENTS

| | | | |
|---|---|---|---|
| 4,377,855 A | 3/1983 | Lavi | |
| 5,270,591 A | 12/1993 | Ross | |
| 5,428,565 A | 6/1995 | Shaw | |
| 5,936,873 A | 8/1999 | Kongetira | |
| 6,191,970 B1 * | 2/2001 | Pereira | ......................... 365/49 |
| 6,240,000 B1 | 5/2001 | Sywyk et al. | |
| 6,243,280 B1 * | 6/2001 | Wong et al. | .................... 365/49 |
| 6,442,054 B1 | 8/2002 | Evans et al. | |
| 6,442,090 B1 | 8/2002 | Ahmed et al. | |
| 6,515,884 B1 | 2/2003 | Sywyk et al. | |
| 6,760,242 B1 * | 7/2004 | Park et al. | ..................... 365/49 |
| 6,804,134 B1 * | 10/2004 | Proebsting et al. | ........... 365/49 |

OTHER PUBLICATIONS

"A Ternary Content-Addressable Memory (TCAM) Based on 4T Static Storage and Including Current-Race Sensing Scheme" IEEE Journal of Solid-State Circuits, vol. 38, No. 1, Jan. 2003, pp. 155-158 by Arsovski et al.
"A Current-Saving Match-Line Sensing Scheme for Content-Adressable Memories" ISSCC 2003, Session 17, SRAM and DRAM, Paper 17.3 by Arsovski et al., pp. 304-305.

* cited by examiner

*Primary Examiner*—My-Trang Nu Ton
(74) *Attorney, Agent, or Firm*—Bradley T. Sako

(57) ABSTRACT

A sense amplifier for a content addressable memory (CAM) device can utilize charge sharing between a match line and a pseudo-supply line to indicate a mis-match indication. A sense amplifier (200) can include match line (202) that can be precharged to a high supply potential (VCC), a sense node (206), and a pseudo-VSS (PVSS) line (204) that can be precharged to a low supply potential (VSS). In a match result, match line (202) can remain precharged, keeping sense device (P2) turned off, and sense node (206) remains low, generating a low output signal (SAOUT). In a mis-match result, match line (202) and sense node (206) can be equalized. A resulting drop in match line (202) potential can turn on sense device (P2), and sense node (206) can be pulled high. As a result, output signal (SAOUT) can be driven high.

20 Claims, 5 Drawing Sheets

US 7,084,672 B1

SENSE AMPLIFIER CIRCUIT FOR CONTENT ADDRESSABLE MEMORY DEVICE

This application claims the benefit of U.S. Provisional Patent Application Ser. No. 60/483,418 filed on Jun. 27, 2003.

TECHNICAL FIELD

The present invention relates generally to sense amplifier circuits, and more particularly to sense amplifier circuits that detect an equalization state.

BACKGROUND OF THE INVENTION

Sense amplifiers are commonly used in memory devices, such as random access memories (RAMs), read only memories (ROMs), and more specialized memories, such as content addressable memories (CAMs).

Continuing goals for nearly all integrated circuits include lower power consumption, higher operating speeds, and lower operating voltages. In the particular case of CAM devices, sensing operations can consume considerable current (and hence power), as such operations typically involve the continuous charging of multiple match lines, and the subsequent discharging of selected match lines. Sense amplifier circuits are usually connected to such match lines to detect a match line state following a compare operation. In particular, for some conventional CAMs, a match line representing a match result (i.e., a HIT) can remain charged, while a match line representing a mismatch result (i.e., a MISS), can be discharged to or at least toward a low voltage power supply (e.g., Vss).

One conventional sense amplifier circuit is disclosed in "A Ternary Content-Addressable Memory (TCAM) Based on 4T Static Storage and Including Current-Race Sensing Scheme", IEEE Journal of Solid-State Circuits, Vol. 38, No. 1, Jan. 2003, pp. 155–158 by Arsovski et al. Another conventional sense amplifier circuit is shown in "A Current-Saving Match-Line Sensing Scheme for Content-Addressable Memories", ISSCC 2003, Session 17, SRAM and DRAM, Paper 17.3 by Arsovski et al., pp. 304–305 (Referred to herein as Arsovski et al. II).

Yet another conventional sense amplifier is shown in FIG. 6. FIG. 6 shows an example of a single ended sense amplifier employed in a ternary CAM device. In FIG. 6, a sense amplifier 600 can be coupled to a compare stack 602. A compare stack 602 represents one of many bit compares in a sense operation. Such bit compares can compare a compare data value (represented by complementary values CD and BCD) to a data value (represented by complementary values D and BD). A compare result is maskable by a mask value MASK. Such a masking capability can form a "ternary" CAM device, as opposed to a binary CAM device.

The conventional sense amplifier 600 includes p-channel precharge transistors P1 and P2 having sources commonly connected to a power supply voltage VCC, and gates commonly connected to a precharge signal PRECHG. The conventional sense amplifier 600 also includes a holding n-channel transistor N1 and sensing n-channel transistor N2. Transistors N1 and N2 may have drains connected to the drains of transistors P1 and P2, respectively. The sources of transistors N1 and N2 can be commonly connected to a match line 604. The gates of transistors N1 and N2 can be commonly connected to a voltage VCCQ. A voltage VCCQ can maintain transistors N1 and N2 in an off state when a match line 604 is precharged, as will be described below.

The drain—drain connection of transistors P2 and N2 can be connected to a sense node 606. Sense node 606 can be precharged by precharge p-channel transistors P3 and P4 arranged in series between sense node 606, and power supply voltage VCC. The potential at sense node 606 can be buffered by series connected inverters INV1 and INV2 to provide sense amplifier output signal SAOUT.

The operation of the conventional sense amplifier 600 will now be described.

In a pre-sense period, match line 604 can be precharged to a voltage VCC-Vtn1. A value Vtn1 can be the threshold voltage of holding transistor N1. It is noted that sensing transistor N2 is designed to have a higher threshold voltage (e.g., at least 200 mV) than holding transistor N1. Thus, once match line 604 is precharged to VCC-Vtn1, sensing transistor N2 is turned off.

In a sense period, data values (e.g., D and BD) can be compared to compare data (e.g., CD and BCD) within a compare stack 602. In the event a sense operation indicates a match (e.g., a HIT), all compare stacks (multiple compare stacks connected to match line 604) can maintain a relatively high impedance between the match line 604 and ground (VSS). In this state, sense amplifier 600 can utilize the difference in threshold voltages of transistors N1 and N2, to keep transistor N2 turned off. With transistor N2 turned off, sense node 606 can be maintained at the precharged VCC potential. Consequently, sense amplifier output signal SAOUT remains high, indicating a HIT state.

In the event a sense operation indicates a mis-match (e.g., a MISS), at least one compare stack will provide a relatively low impedance between the match line 604 and ground (VSS). Thus, the match line 604 will go toward ground (VSS). When the gate-to-source voltage of transistor N2 is larger than Vtn2, the sense transistor N2 will turn on. With transistor N2 on, sense node 606 will discharge through sense transistor N2 and the compare stack 602 to ground (VSS). Consequently, the sense amplifier output signal SAOUT transitions low, indicating a MISS state.

Thus, the conventional sense amplifier 600 operation can include precharging a match line 604 to VCC-Vtn1, and then discharging the same match line 604 in the event of a MISS state. It is understood that a conventional CAM includes numerous match lines, and in a given sense operation, MISS states are far more common than HIT states. As a result, match operations can consume considerable current as match lines are continuously precharged and then discharged.

In light of the above, it would be desirable to arrive at a sense amplifier circuit for a CAM device that may have lower current consumption than conventional approaches. It would also be desirable for such a sense amplifier circuit to operate at a relatively lower operating voltage, and relatively higher speed than other conventional approaches.

SUMMARY OF THE INVENTION

The present invention can include a sense amplifier circuit having a first pre-charge device with a controllable impedance path coupled between a sense node and a first predetermined potential. The sense amplifier circuit can also include a sense transistor having a gate coupled to a first electrically isolatable line, a drain coupled to the sense node, and a source coupled to a second predetermined potential. A plurality of compare circuits can be coupled between the first electrically isolatable line and a second electrically isolatable line. Each compare circuit can enable a low impedance path between the first electrically isolatable line and the second electrically isolatable line according to a comparison between at least two data bit values.

In such an arrangement, a sense transistor can be activated according to a change in potential at its gate, rather than its drain/source. Such an arrangement can result in a sense circuit that does not need transistors having different threshold voltages.

According to one aspect of the embodiments, a first precharge device can include a transistor of a first conductivity type and a sense transistor can be of a second conductivity type.

In such an arrangement, a source-drain voltage of a sense transistor can set to relatively large value to enable rapid sensing.

According to another aspect of the embodiments, a first electrically isolatable line can be a match line that is precharged toward or to a first power supply voltage before being electrically isolated. The second electrically isolatable line can be a pseudo-power supply line that is precharged toward or to a second power supply voltage before being electrically isolated.

In such an arrangement, sensing can depend on two electrically isolated lines precharged to different potentials. This can enable "equalization" sensing.

The present invention can also include a sense amplifier circuit with a first electrically isolatable line, a second electrically isolatable line, and a sense device. A sense device can provide a low impedance path between a first voltage and a sense node in response to the voltage between the first and second electrically isolatable lines being driven toward an equalization potential.

In such an arrangement, a sense amplifier may sense an equalization operation, rather than a maintained precharge operation, as is the case for conventional approaches.

According to another aspect of the embodiments, each CAM cell can perform less than 0.7 femtoJoules per bit of work per search cycle, in the event of a mismatch between the compare data bit and stored data bit.

In this way, a CAM device can have reduced power consumption over conventional approaches.

The present invention may also include a method for sensing compare results in a content addressable memory (CAM) device. The method can include, in a pre-sense period, precharging a first line to a first voltage, precharging a second line to a second voltage, and electrically isolating the first and second lines. In a sense period, the method can generate a mis-match indication when the first and second lines are equalized, and generate a match indication when the first line remains at essentially the first voltage.

In this the sensing method can sense an equalization state instead of a maintained precharge state, as is the case for conventional approaches.

According to another aspect of the embodiments, equalizing first and second lines can generate an equalization voltage on the first and second lines, and the difference in potential between the equalization voltage and the first potential can exceed a threshold voltage of sense transistor. Further, changing the sense node from the second voltage to the first voltage can include activating the sense transistor.

In this way, a sensing method can rely on a transistor that does not necessarily need a different threshold voltage than other transistors of the same conductivity type in the sense amplifier.

DETAILED DESCRIPTION

According to embodiments of the present invention, a sense amplifier circuit may operate in conjunction with a "pseudo-supply" scheme. In particular, the embodiments can work in conjunction with a pseudo-VSS arrangement. A pseudo-VSS arrangement can include a pseudo-VSS node that is preset (e.g., pre-discharged) to a predetermined value (e.g., VSS). As will be described more detail below, such an arrangement can utilize a charge sharing mechanism that can conserve charge on a match line, thus reducing overall current consumption.

Various particular examples of a content addressable memory (CAM) that can include a pseudo-VSS arrangement is shown U.S. Pat. No. 6,515,884 issued to Stefan Sywyk and Eric Voelkel on Feb. 4, 2003. Of course such examples should not necessarily be construed as limiting to the present invention.

Figure 1:
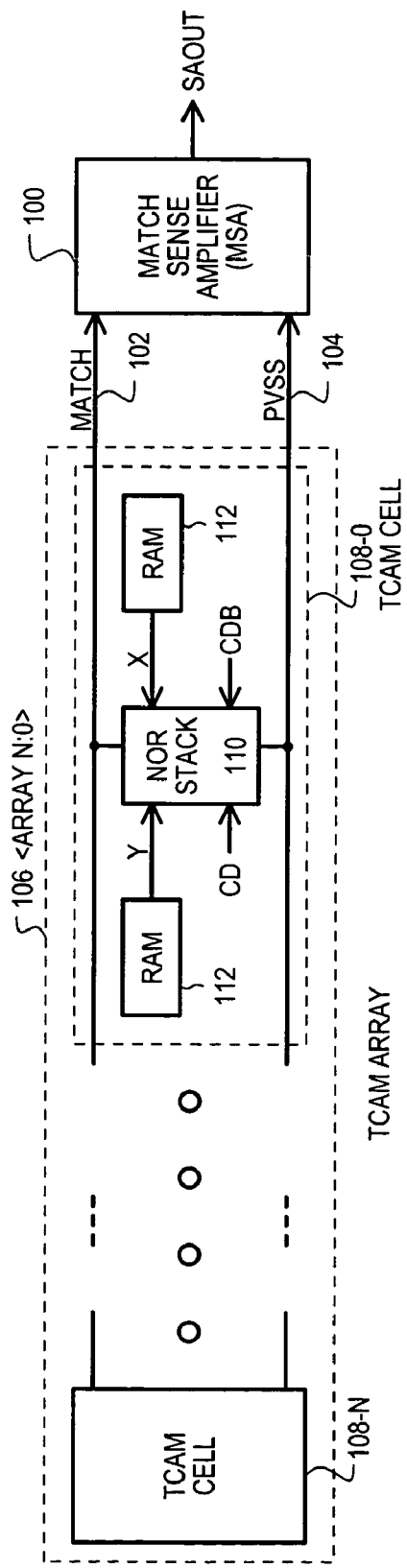
FIG. 1 is a block diagram of showing the application of a sense amplifier circuit according to one embodiment of the present invention.

FIG. 1 shows one particular application of a sense amplifier according to embodiments of the present invention. As shown in FIG. 1, a sense amplifier 100 can receive, as inputs, a match line 102 and pseudo-VSS line 104. A match line 102 can provide a signal MATCH that can indicate if an applied compare data value matches or does not match a stored data value. A pseudo-VSS line 104 can provide an electrically isolatable potential node—and thus can be distinguished from a conventional power supply node, such as VSS.

In FIG. 1, a match line 102 and pseudo-VSS line 104 can be provided from an array of memory cells. In the particular example of FIG. 1, an array of content addressable memory (CAM) cells can be provided, with each CAM cell being connected to a corresponding match line. Thus, in FIG. 1, CAM array 106 can include a number of CAM cells 108-0 to 108-N.

In the example of FIG. 1, each CAM cell (108-0 to 108-N) can include a logic stack 110 that can selectively provide a relatively low impedance path between a match line 102 and pseudo-VSS line 104 according to match data values and compare data values in the case of "binary" CAM cells, and additionally according to a mask data value in the case of "ternary" CAM cells.

The particular logic stack 110 of FIG. 1 is a NOR stack. A NOR stack can include a logic circuit that provides a NOR, or NOR-like function, such as an XNOR type function. A logic stack 110 can receive data values X and Y as inputs, as well as compare data values CD and BCD as inputs. Data values (X and Y) can be provided from a random access memory (RAM) cell, or the like 112. Such values can include, as but two examples, stored data values and/or mask data values. Compare data values (CD and BCD) can be complementary values supplied to a memory cell for a compare operation.

Figure 2:
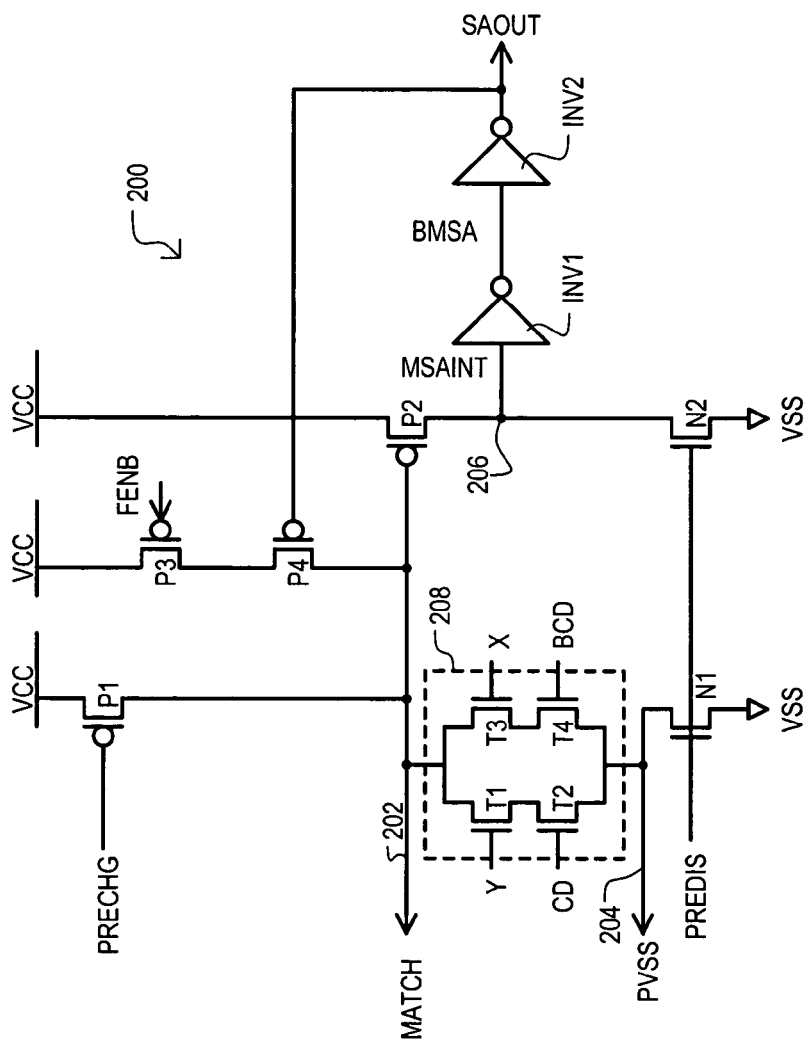
FIG. 2 is a schematic diagram of a sense amplifier according to a first embodiment of the present invention.

A sense amplifier circuit according to one embodiment is set forth in FIG. 2, and designated by the general reference character 200. A sense amplifier 200 can receive a match line 202 and a pseudo-VSS (hereinafter PVSS) line 204 as inputs. A sense operation result can be generated at a sense node 206.

A sense amplifier 200 can also include a precharge device P1, a sensing device P2, a latch enable device P3, a latching device P4, PVSS pre-discharge device N1, and sense node pre-discharge device N2. Still further, a sense amplifier 200 can also include two inverters INV1 and INV2 arranged in series.

A precharge device P1 can be a p-channel transistor having a source-drain path situated between a high power supply VCC and match line 202. A gate of precharge device P1 can receive a precharge signal PRECHG.

A sensing device P2 can be a p-channel transistor with a source connected to a high power supply VCC, a gate connected to match line 202, and a drain connected to sense node 206.

Latch enable device P3 and latching device P4 can be p-channel transistors having source-drain paths arranged in series between high power supply VCC and match line 202. A gate of latch enable device P3 can receive an enable signal FENB. A gate of latching device P4 can receive an output of inverter INV2, which may also be a sense output signal SAOUT.

PVSS pre-discharge device N1 and sense node pre-discharge device N2 can be n-channel transistors. PVSS pre-discharge device N1 can have a source-drain path between PVSS line 204 and a low power supply VSS, and a gate connected to a pre-discharge signal PREDIS. Sense node pre-discharge device N2 can have a source-drain path between a sense node 206 and a low power supply VSS, and a gate connected to a pre-discharge signal PREDIS.

Inverters INV1 and INV2 can be arranged in series between the sense node 206 and the gate of latching device P4. An output of inverter INV2 can be an output signal SAOUT.

FIG. 2 also shows a CAM cell compare stack 208 situated between a match line 202 and a PVSS line 204. It is understood that multiple such compare stacks can be arranged between match line 202 and PVSS line 204. The particular compare stack of FIG. 2 includes transistors T1 to T4. Transistors T1 and T2 can have source-drain paths arranged in series between match line 202 and PVSS line 204. Transistors T3 and T4 can be arranged in parallel with transistors T1 and T2, also having source-drain paths arranged in series between match line 202 and PVSS line 204.

Transistor T1 can receive a data value "Y" at its gate, which may be a complementary data value. Transistor T2 can receive a compare data value CD at its gate. Transistor T3 can receive a data value "X" at its gate, which may be a data value. Transistor T4 can receive a complementary compare data value BCD at its gate. In the embodiment of FIG. 2, transistors T1 to T4 can be n-channel transistors.

Figure 3:
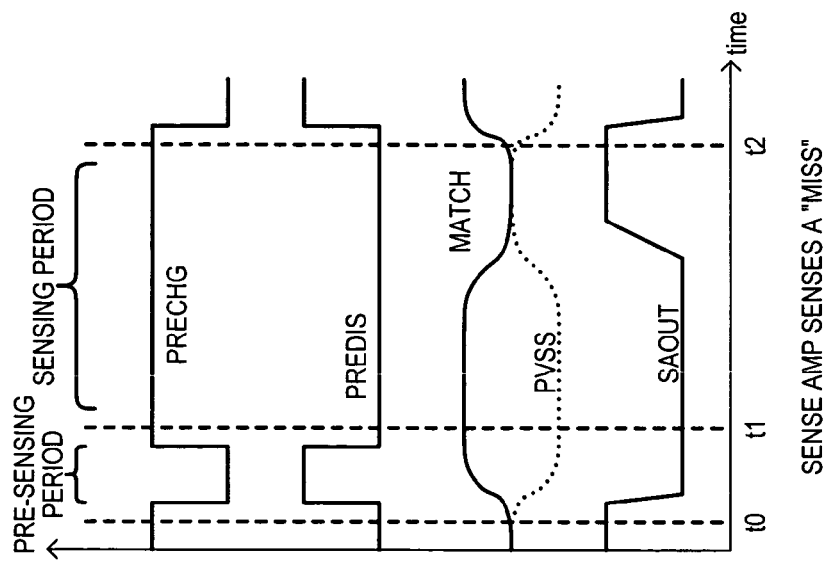
FIG. 3 is a timing diagram showing the operation of the embodiment shown in FIG. 2.

The operation of a sense amplifier 200 will now be described in conjunction with a timing diagram shown in FIG. 3. FIG. 3 shows a response of a precharge signal PRECHG, a pre-discharge signal PREDIS, and output signal SAOUT. In addition, a response of a match line 202 is shown as MATCH and a response of a PVSS line 204 is shown as PVSS.

In the very particular example of FIG. 3, the operation of a sense amplifier 200 can be divided into a pre-sensing period and a sensing period. A pre-sensing period can be about ¼ of a clock cycle, while a sensing period can be about ¾ of a clock cycle.

At about time t0, at the start of a pre-sensing period a precharge signal PRECHG can transition from a high level to a low level, turning on precharge device P1 and precharging match line 202 to about the VCC level. At essentially the same time, pre-discharge signal PREDIS can transition to a high level, turning on PVSS pre-discharge device N1 and sense node pre-discharge device N2. This can set the PVSS line 204 and sense node 206 to about the VSS level. With sense node 206 at VSS, output signal SAOUT can be driven to a low level by inverters INV1 and INV2. A low output value SAOUT can turn on latching device P4. At this time latch enable device P3 can also be turned on, thereby latching a match line 202 at a high level.

At about time t1, at the end of a pre-sensing period a precharge signal PRECHG can return high, turning off precharge device P1. At the same time, or prior to precharge signal PRECHG returning high, enable signal FENB can also transition high, turning off latch enable device P3. Thus, a match line 202 can be in a floating state at or about a VCC level.

Also at about time t1, a pre-discharge signal PREDIS can return low, turning off PVSS pre-discharge device N1 and sense node pre-discharge device N2. Thus, a PVSS line 204 can be in a floating state at or about a VSS level.

The operation of a sense amplifier 200 can vary according to whether the sensing operation detects a match (e.g., HIT) or a mis-match (e.g., MISS).

In the event of a HIT, the potential of a match line 202 can remain essentially at a VCC level. As a result, a gate-to-source voltage of sense transistor P2 can remain at about 0V and sense transistor P2 can remain turned off. Because sense node pre-discharge device N2 remains off, sense node 206 can remain at the pre-discharged level of about VSS. Thus, a sense output signal SAOUT can remain unchanged, indicating a HIT.

In the event of a MISS, at least one compare stack (e.g., 208) can provide a conducting path between a match line 202 and a PVSS line 204. This can result in a charge sharing between match line 202 and a PVSS line 204 (which were previously floating at different potentials) as the potential between the two is equalized. Such an equalized voltage can be at least a p-channel threshold voltage (Vtp) lower than the pre-charge voltage of the match line 202 (which was about VCC).

With match line 202 at the equalized voltage, sense transistor P2 can be turned on, charging sense node 206 to a high voltage. Such a high level propagates through inverters INV1 and INV2, resulting in output signal SAOUT transitioning high, indicating a MISS.

It is noted that the equalized potential on match lines 202 and PVSS line 204 (shown in the time period preceding time t2 in which MATCH and PVSS are the same) results in charge conservation. Such charge conservation is in contrast to other conventional approaches, as a match line 202 is never completely discharged, remaining at the equalized potential in the event of a MISS result. Similarly, a PVSS line 204 is never completely charged, remaining at the equalized potential in the event of a MISS.

As is also shown in FIG. 3, in a subsequent pre-sensing period, a match line 202 will be precharged once again to VCC, or so, while a PVSS line 204 can be pre-discharged to VSS, or so.

The utilization of PVSS line, as set forth in FIG. 2, can also provide a self-limiting mechanism for leakage current within a compare stack 208. In particular, in the event of a HIT, while a match line 202 may be initially at a precharge level of VCC, leakage current of a compare stack 202 can result in PVSS line 204 rising (e.g., up to 200 mV from 0 V). However, in such a state, at least one n-channel transistor in each leg of a compare stack 208 can receive 0 volts at its gate. Thus, a gate-to-source voltage for such devices can be negative, which can slow down, and eventually stop such current leakage.

Preferably, as shown in the first embodiment, sensing can be accomplished by sensing with a p-channel device. However, in an alternate embodiment, sensing can be accomplished with an n-channel device. Such an approach is shown in FIG. 4.

Figure 4:
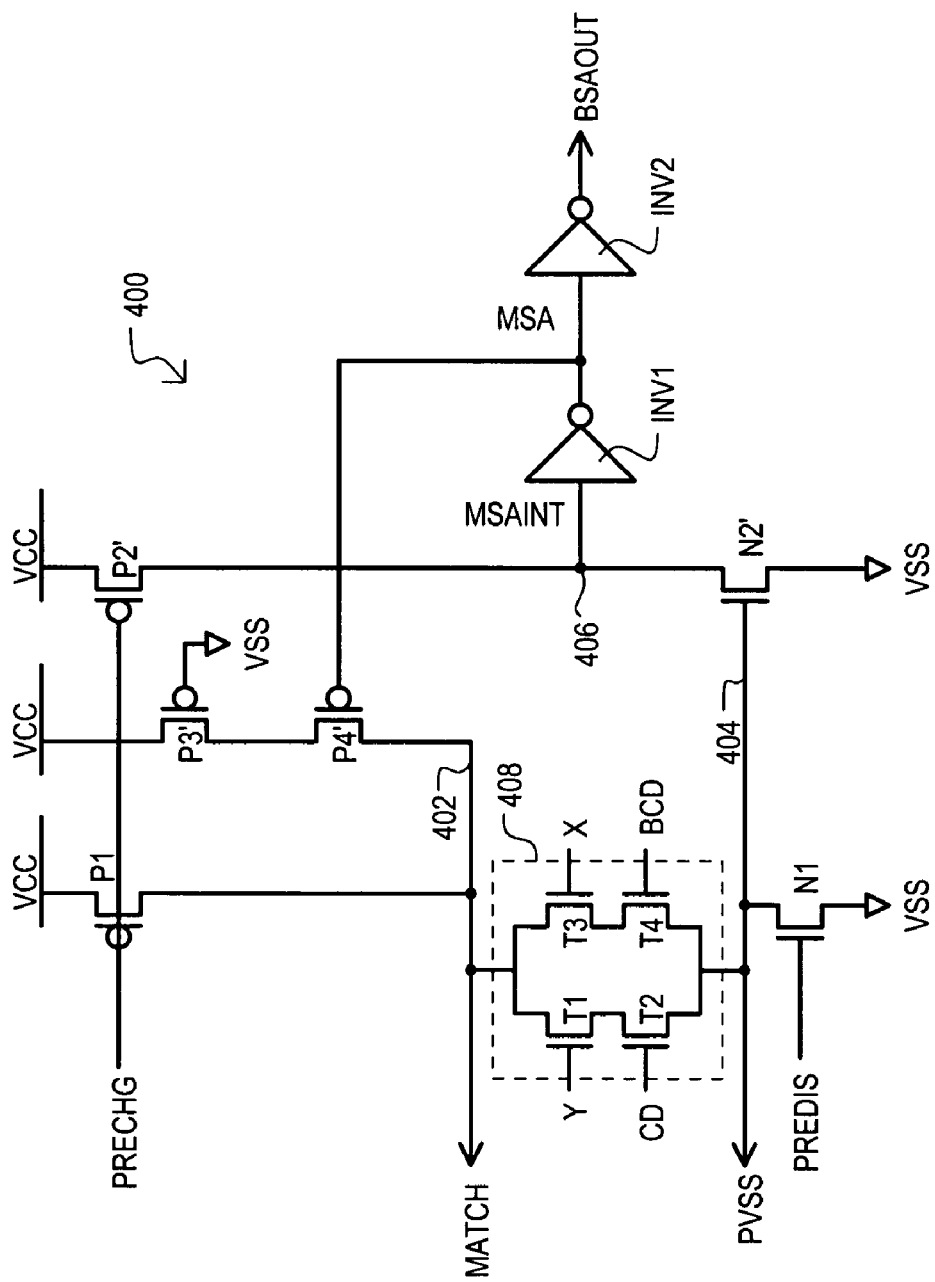
FIG. 4 is a schematic diagram of a sense amplifier according to a second embodiment of the present invention.

A sense amplifier according to a second embodiment is set forth in FIG. 4 and designated by the general reference character 400. A sense amplifier 400 can include some of the same general circuit sections as the first embodiment 200. To that extent, like circuit portions will be referred to by the same reference character, but with a first digit being a "4" instead of a "2".

FIG. 4 can differ from FIG. 2 in that a sensing operation can occur by detecting a difference in potential of a PVSS line 404 instead of a difference in potential for match line 402. Thus, a PVSS line 404 can be connected to a gate of sensing device N2', which can be an n-channel transistor. In addition, sense node 406 can be precharged by precharge device P2'. Further, match line 402 may not be connected to a sensing device, but to precharge and latching devices, P1 and P4', respectively.

The logic of the output signal of the sense amplifier 400 can be different than that of the embodiment of FIG. 2. In particular, sense amplifier 400 can provide an output signal BSAOUT, which can be set to a high logic value in a pre-sensing period. Subsequently, in the event of a "HIT", such a signal BSAOUT can remain high. In the event of a MISS the output can transition low. Due to this arrangement, the output of inverter INV1 is fed back to the gate of latching transistor P4' instead of the output of inverter INV2, as is the case of FIG. 2.

As in the case of the embodiment of FIG. 2, The operation of a sense amplifier 400 can be divided into two periods: a pre-sensing period and a sensing period. In a pre-sensing period, a precharge signal PRECHG can transition from a high level to a low level, turning on precharge devices P1 and P2 to precharge match line 402 and sense node 406 to the VCC level. At essentially the same time, pre-discharge signal PREDIS can transition to a high level, turning on PVSS pre-discharge device N1. This can set the PVSS line 404 to the VSS level. With sense node 406 at VCC, output signal BSAOUT can be driven to a high level by inverters INV1 and INV2.

A low output value MSA from inverter INV1 can turn on latching device P4'. Latch enable device P3 can be a "leaker" device that is always on. Thus, a match line 402 can be latched at a high level.

At the end of a pre-sensing period, a precharge signal PRECHG can return high, turning off precharge devices P1 and P2'. Also, at the end of a pre-sensing period, a pre-discharge signal PREDIS can return low, turning off PVSS pre-discharge device N1. Thus, a PVSS line 204 can be isolated in a floating state at or about a VSS level, and match line 402 can be isolated in a floating state at or about a VCC level.

The operation of a sense amplifier 400 can vary according to whether the sensing operation detects a match (e.g., HIT) or a mis-match (e.g., MISS).

In the event of a HIT, the potential of a PVSS line 404 can remain essentially at a VSS level. As a result, a gate-to-source voltage of sense transistor N2' can remain at about 0V, and sense transistor N2' can remain turned off. Sense node 406 can remain at the precharged level of about VCC. Thus, a sense output signal BSAOUT can remain unchanged, indicating a HIT.

In the event of a MISS, at least one compare stack (e.g., 408) can provide a conducting path between a match line 402 and a PVSS line 404. This can result in a charge sharing between match line 402 and a PVSS line 404 (which were previously at different potentials). Such a charge sharing can result in a potential at the PVSS line 404 that is at least an n-channel threshold voltage (Vtn) higher than the pre-discharge voltage of the PVSS line 404 (which was about VSS).

With PVSS line 404 at the equalized voltage, sense transistor N2' can be turned on, discharging sense node 406 to a low voltage. Such a low level propagates through inverters INV1 and INV2. As a result, latching device P4' is turned off by inverter INV1, and output signal BSAOUT can transition low, indicating a MISS.

Like the example of FIG. 2, the equalized potential on match lines 402 and PVSS line 404 can result in charge conservation superior to other conventional approaches, as a match line 402 is never completely discharged to a low supply voltage VSS, falling instead to an equalized potential in the event a MISS result (with some pull-up influence from leaker transistor P3'). Similarly, a PVSS line 404 is never completely charged, remaining at the equalized potential in the event of a MISS.

In a subsequent pre-sensing period, a match line 402 will be precharged once again to VCC, or so, while a PVSS line 404 can be pre-discharged to VSS, or so.

A sense amplifier according to the present invention can be readily implemented by an existing complementary MOS (CMOS) type manufacturing process. Further, as noted above, such a process does not necessarily have to include additional steps (e.g., Vt implants) to establish different threshold voltages for same conductivity type transistors.

Figure 6:
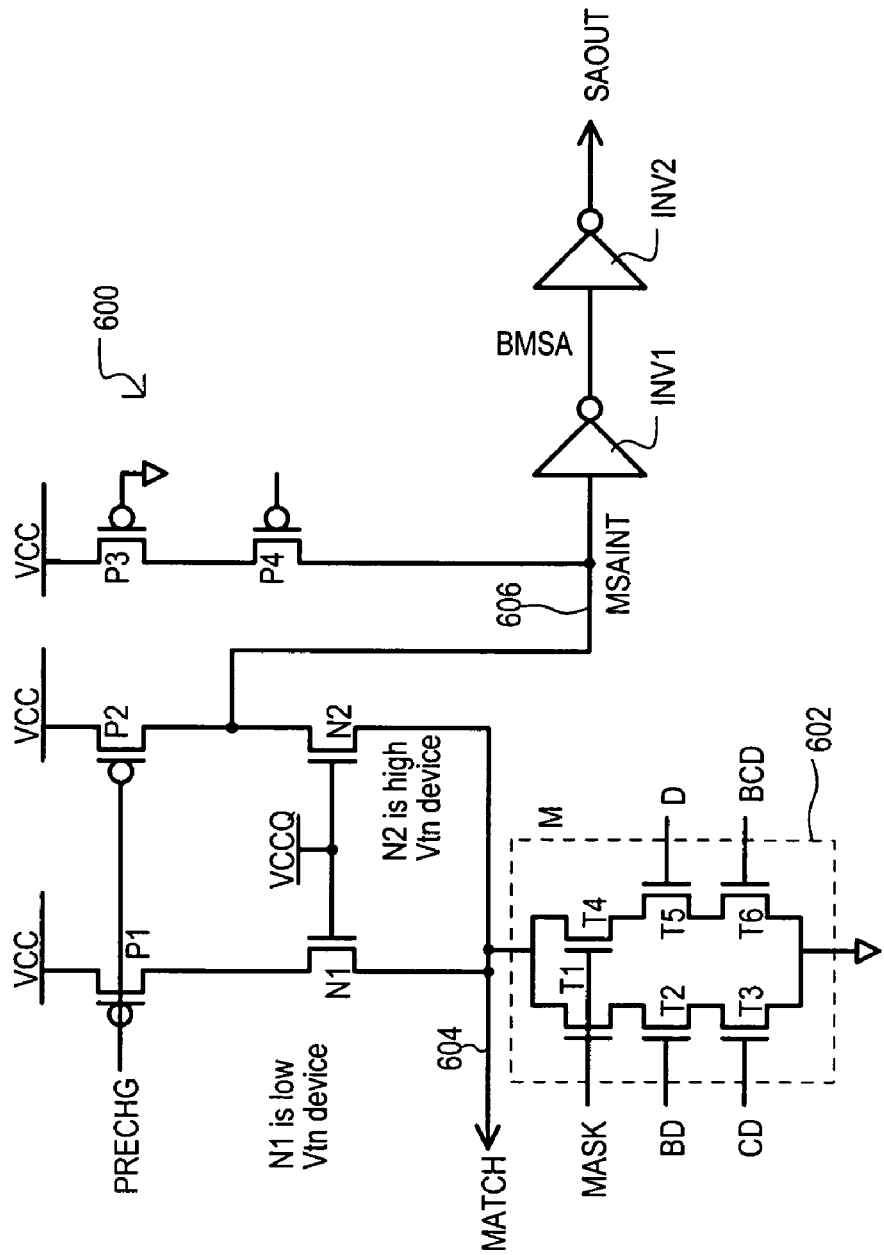
FIG. 6 is a schematic diagram of one example of a conventional sense amplifier.

Further, unlike the conventional arrangement of FIG. 6, sensing does not utilize different threshold voltage transistors. That is, sensing is determined according to a threshold voltage of one device (e.g., P2 of FIG. 2 or N2 of FIG. 4), and not according to a difference in same conductivity type transistors (e.g., N1 and N2 of FIG. 6).

Even further, as discussed, leakage within a compare stack can be self-limiting.

Still further, as noted above, the present invention can sense with charge sharing between a match line and a pseudo-VSS line. This can reduce current consumption.

Comparative features between the conventional approach of FIG. 6, Arsovski et al. II and the embodiment of FIG. 2 are set forth below in Table 1.

TABLE 1

| Design | Current Consumption | Power | Speed | Power Supply | Process | Work |
|---|---|---|---|---|---|---|
| FIG. 6 | 0.36 uA/bit | 0.43 uW/bit | 133 MHz | 1.2 V | 130 nm | 3.2 fJ/bit/cycle |

TABLE 1-continued

| Design | Current Consumption | Power | Speed | Power Supply | Process | Work |
|---|---|---|---|---|---|---|
| Arsovski et al. II | N/A | N/A | N/A | N/A | 130 nm | 1.3 fJ/bit/search |
| FIG. 2 | 0.14 uA/bit | 0.14 uW/bit | 250 MHz | 1.0 V | 90 nm | 0.56 fJ/bit/cycle |

In Table 1, a "Design" column identifies the design, "Current Consumption" identifies the amount of current consumed per compare bit, "Power" identifies the amount of power consumed per bit, "Speed" represents a clock speed of a device of the design, "Power Supply" is the voltage supplied to the device of the design, "Process" is the manufacturing process, "Work" is the amount of work done per bit.

From the above, it is seen that the embodiment of the present invention can provide advantageous low work values per bit.

In this way, the present invention can provide a sense amplifier with high-speed and lower power operation, as compared to conventional approaches.

Also, a sensing scheme of the embodiments can utilize a voltage difference between a match line before and after an equalization operation. That is, when at least one bit mismatch occurs (i.e., a mismatch or MISS) for the match line, such voltage difference can exist. In one particular approach, the voltage difference can be greater than one threshold voltage (Vtp) of a PMOS transistor P2. This can turn on transistor P2, which charges a sense node 206 from a pre-discharge voltage of VSS to a voltage of VCC. As a result, output signal SAOUT can change from a logic low to a logic high value.

However, if no bit mismatch occurs (i.e., a match or HIT), such voltage difference does not exist, or is only minimal. Thus, a match line can remain near VCC (but not VCC-Vtn, as in conventional approaches). Transistor P2 can remain turned off and a sense node 206 can remain at a pre-discharge voltage of VSS. As a result, output signal SAOUT can remain at a logic high value.

Because a match line voltage is never discharged, charge on a match line can be conserved, thereby saving power.

Referring now to FIGS. 5A to 5F, a number of circuit portions will be described that can be included in the various embodiments.

Figure 5E:
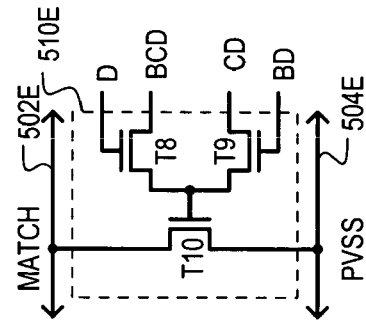
FIGS. 5A to 5F are schematic diagrams of circuit portions that can be included in the various embodiments.
Figure 5F:
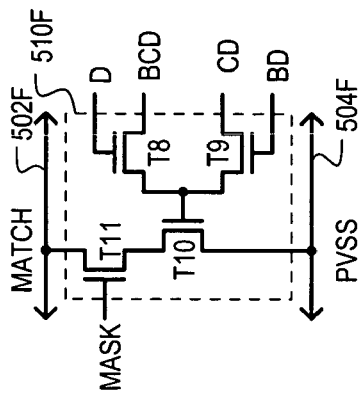
Figure 5C:
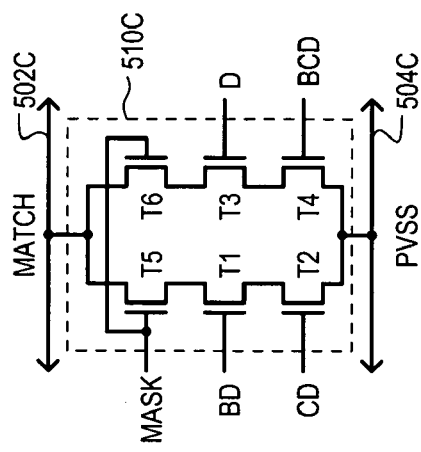
Figure 5D:
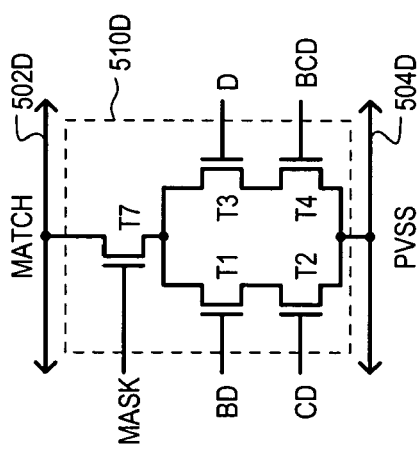
Figure 5A:
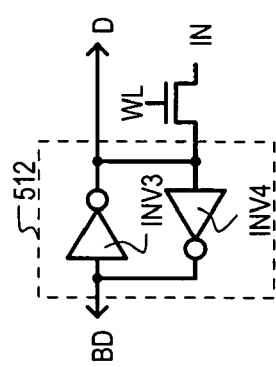

FIG. 5A shows one of the many possible circuits that may be utilized as a RAM cell, such as that shown as 112 in FIG. 1. A RAM cell 512 may generally have a static RAM design, including cross coupled inverters INV3 and INV4. Outputs of inverters (INV3 and INV4) can provide complementary data values (D and BD). In the very particular example of FIG. 5A, a data value may be loaded by way of an input IN by activation of word line signal WL.

Figure 5B:
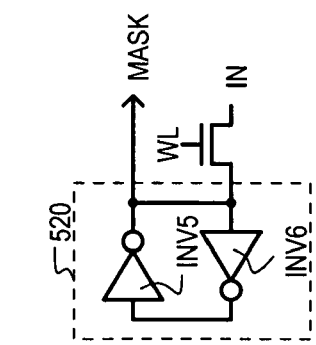

FIG. 5B shows one of the many possible circuits that may be utilized to provide a MASK value for a ternary CAM cell. A circuit 520 may generally have the same structure as that shown in FIG. 5B.

FIG. 5C shows one example of a circuit that may be utilized as a logic stack, such as that shown as 110 in FIG. 1, and/or 208 in FIG. 2, and/or 408 in FIG. 4. The logic stack 510C of FIG. 5C can include transistors T1–T4 having the same general configuration as logic stack 208 in FIG. 2. However, logic stack 510C can further include a transistor T5 having a source drain path between the drain of transistor T1 and a match line 502C, and transistor T6 having a source drain path between the drain of transistor T3 and a match line 502C. Transistors T5 and T6 can be n-channel transistors. Gates of transistors T5 and T6 can receive a mask value MASK. In the event a mask value is active (low, in this example), logic stack 504C can provide a high impedance path regardless of a corresponding data value (D/BD) or compare data value (CD/BCD). Thus, FIG. 5C presents a logic stack that can be included in a ternary CAM.

FIG. 5D shows another example of a circuit that may be utilized as a logic stack. The logic stack 510D of FIG. 5D has the same general structure as FIG. 5C, but includes one transistor T7 in place of commonly activated parallel transistors T5 and T6 of FIG. 5C. Thus, FIG. 5D presents a logic stack that can also be included in a ternary CAM.

FIG. 5E shows a third example of a circuit that may be utilized as a logic stack. The logic stack 510E of FIG. 5E includes a transistor T10 having a source drain path coupled between match line 502E and a PVSS line 504E. A transistor T8 can have a source drain path coupled between the gate of T10 and a complementary compare data value BCD, and can receive a data value D at its gate. A transistor T9 can have a source drain path coupled between the gate of T10 and a compare data value CD, and can receive a complementary data value BD at its gate. Transistors T8–T10 can be n-channel transistors. Logic stack 510E can be utilized in a binary CAM.

FIG. 5F shows a fourth example of a circuit that may be utilized as a logic stack. The logic stack 510F of FIG. 5F has the same general structure as FIG. 5E, but includes one transistor T11 having a source drain path between a drain of transistor T10 and a match line 502F. A gate of transistor T11 receives a mask value MASK. In the event a mask value MASK is active (low, in this example), logic stack 504F can provide a high impedance path regardless of a corresponding data value (D/BD) or compare data value (CD/BCD). Thus, FIG. 5F presents a logic stack that can be included in a ternary CAM.

In the arrangement of FIGS. 5E and 5F, it is understood that compare data values BCD and CD can both be driven low in a pre-sensing period.

While the above embodiments have distinguished "pre-charge" devices from "pre-discharge" devices, it is understood that both such devices can be referred to as precharge devices. That is, the term precharge can indicate a node that is set to a low voltage (e.g., ground, VSS).

It is understood that the embodiments of the invention may be practiced in the absence of an element and or step not specifically disclosed. That is, an inventive feature of the invention can be elimination of an element or step.

Accordingly, while the various aspects of the particular embodiments set forth herein have been described in detail, the present invention could be subject to various changes, substitutions, and alterations without departing from the spirit and scope of the invention.

What is claimed is:

1. A sense amplifier circuit, comprising:
   a first pre-charge device having a controllable impedance path coupled between a sense node and a first predetermined potential;
   a sense transistor having a gate coupled to a first electrically isolatable line, a drain coupled to the sense node, and a source coupled to a second predetermined potential; and
   a plurality of compare circuits coupled between the first electrically isolatable line and a second electrically isolatable line, each compare circuit enabling a low impedance path between the first electrically isolatable line and the second electrically isolatable line according to a comparison between at least two data bit values.

2. The sense amplifier circuit of claim 1, wherein:
the first precharge device comprises a transistor of a first conductivity type and the sense transistor is of a second conductivity type.

3. The sense amplifier circuit of claim 1, wherein:
the first electrically isolatable line is a match line that is precharged toward a first power supply voltage before being electrically isolated; and
the second electrically isolatable line is a pseudo-power supply line that is precharged toward a second power supply voltage before being electrically isolated.

4. The sense amplifier circuit of claim 1, further including:
a second pre-charge device having a controllable impedance path coupled between the second electrically isolatable line and the first predetermined potential.

5. The sense amplifier circuit of claim 1, further including:
a third precharge device having a controllable impedance path coupled between the first electrically isolatable line and the second predetermined potential.

6. The sense amplifier circuit of claim 1, further including:
a latching device that enables a low impedance path between the first electrically isolatable line and the second predetermined potential in response to the sense node potential.

7. The sense amplifier circuit of claim 1, further including:
each compare circuit includes a first current path arranged in parallel with a second current path, each current path including at least two insulated gate field effect transistors having source-drain paths arranged in series.

8. A sense amplifier circuit, comprising:
a first electrically isolatable line;
a second electrically isolatable line; and
a sense device that provides a low impedance path between a first voltage and a sense node in response to the voltage between the first and second electrically isolatable lines being driven toward an equalized potential, the sense node providing a comparison result signal.

9. The sense amplifier circuit of claim 8, further including:
a node precharge device that provides a low impedance path between a second voltage and the sense node in response to a precharge signal.

10. The sense amplifier circuit of claim 8, further including:
a first line precharge device that provides a low impedance path between the first voltage and the first electrically isolatable line when a precharge signal is active, and provides a high impedance path between the first voltage and the first electrically isolatable line when the precharge signal is inactive.

11. The sense amplifier circuit of claim 8, further including:
a second line precharge device that provides a low impedance path between the second voltage and the second electrically isolatable line when a precharge signal is active, and provides a high impedance path between the second voltage and the second electrically isolatable line when the precharge signal is inactive.

12. The sense amplifier circuit of claim 8, further including:
a feedback path between the sense node and a latching device that provides a feedback signal that follows the sense node voltage; and
the latching device provides a low impedance path between the first electrically isolatable line and the first voltage in response to the feedback signal.

13. The sense amplifier circuit of claim 8, further including:
a plurality of content addressable memory (CAM) cells coupled between the first and second electrically isolatable lines, each CAM cell providing a comparison result between a compare data bit and a stored data bit.

14. The sense amplifier circuit of claim 13, wherein:
each CAM cell performs less than 0.7 femtoJoules per bit of work per search cycle, in the event of a mismatch between the compare data bit and stored data bit.

15. A method for sensing compare results in a content addressable memory (CAM) device, comprising the steps of:
in a pre-sense period, precharging a first line to a first voltage, precharging a second line to a second voltage, and electrically isolating the first and second lines; and
in a sense period, generating a mis-match indication when the first and second lines are equalized, generating a match indication when the first line remains at essentially the first voltage.

16. The method of claim 15, wherein:
precharging the first line to the first voltage includes precharging the first line toward a high power supply potential, and
precharging the second line to the second voltage includes precharging the second line toward a low power supply potential.

17. The method of claim 15, further including:
the compare operation includes comparing a multi-bit compare data value to a multi-bit stored value; and
providing a low impedance path between the first line and second line for each mis-match between a compare data bit and a corresponding stored data bit.

18. The method of claim 15, further including:
in the pre-sense period, precharging a sense node to the second voltage; and
in the sense period, generating the mis-match indication includes changing the sense node from the second voltage to the first voltage.

19. The method of claim 18, wherein;
equalizing the first and second lines generates an equalization voltage on the first and second lines, and the difference in potential between the equalization voltage and the first potential exceeds a threshold voltage of sense transistor; and
changing the sense node from the second voltage to the first voltage includes activating the sense transistor.

20. The method of claim 15, wherein:
generating the mis-match indication includes doing no more than 0.7 femtoJoules of work per bit per compare cycle.

* * * * *